(12) United States Patent
Duong et al.

(10) Patent No.: US 12,349,282 B2
(45) Date of Patent: Jul. 1, 2025

(54) CAPACITORS IN THROUGH GLASS VIAS

(71) Applicant: Intel Corporation, Santa Clara, CA (US)

(72) Inventors: Benjamin Duong, Chandler, AZ (US); Aleksandar Aleksov, Chandler, AZ (US); Helme A. Castro De La Torre, Gilbert, AZ (US); Kristof Darmawikarta, Chandler, AZ (US); Darko Grujicic, Chandler, AZ (US); Sashi S. Kandanur, Phoenix, AZ (US); Suddhasattwa Nad, Chandler, AZ (US); Srinivas V. Pietambaram, Chandler, AZ (US); Rengarajan Shanmugam, Chandler, AZ (US); Thomas L. Sounart, Chandler, AZ (US); Marcel Wall, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 17/482,399

(22) Filed: Sep. 22, 2021

(65) Prior Publication Data

US 2023/0091666 A1   Mar. 23, 2023

(51) Int. Cl.
*H05K 1/18*   (2006.01)
*H01G 4/33*   (2006.01)
*H05K 1/03*   (2006.01)
*H05K 1/11*   (2006.01)

(52) U.S. Cl.
CPC .............. *H05K 1/185* (2013.01); *H01G 4/33* (2013.01); *H05K 1/0306* (2013.01); *H05K 1/115* (2013.01); *H05K 2201/09545* (2013.01); *H05K 2201/096* (2013.01)

(58) Field of Classification Search
None
See application file for complete search history.

(56) References Cited

U.S. PATENT DOCUMENTS

| | | | |
|---|---|---|---|
| 2014/0035892 A1* | 2/2014 | Shenoy | H01L 23/5389 345/205 |
| 2016/0095221 A1* | 3/2016 | Ramachandran | H01L 25/0657 361/783 |
| 2020/0051749 A1* | 2/2020 | Suemasa | H01G 4/33 |

* cited by examiner

*Primary Examiner* — Hoa C Nguyen
*Assistant Examiner* — John B Freal
(74) *Attorney, Agent, or Firm* — Schwabe, Williamson & Wyatt P.C.

(57) ABSTRACT

Embodiments described herein may be related to apparatuses, processes, and techniques directed to embedding capacitors in through glass vias within a glass core of a substrate. In embodiments, the through glass vias may extend entirely from a first side of the glass core to a second side of the glass core opposite the first side. Layers of electrically conductive material and dielectric material may then be deposited within the through glass via to form a capacitor. the capacitor may then be electrically coupled with electrical routings on buildup layers on either side of the glass core. Other embodiments may be described and/or claimed.

23 Claims, 14 Drawing Sheets

CAPACITORS IN THROUGH GLASS VIAS

FIELD

Embodiments of the present disclosure generally relate to the field of semiconductor packaging, and in particular to capacitors within a glass substrate.

BACKGROUND

Continued growth in computing and mobile devices will continue to increase the demand for compact semiconductor packages.

DETAILED DESCRIPTION

Figure 1:
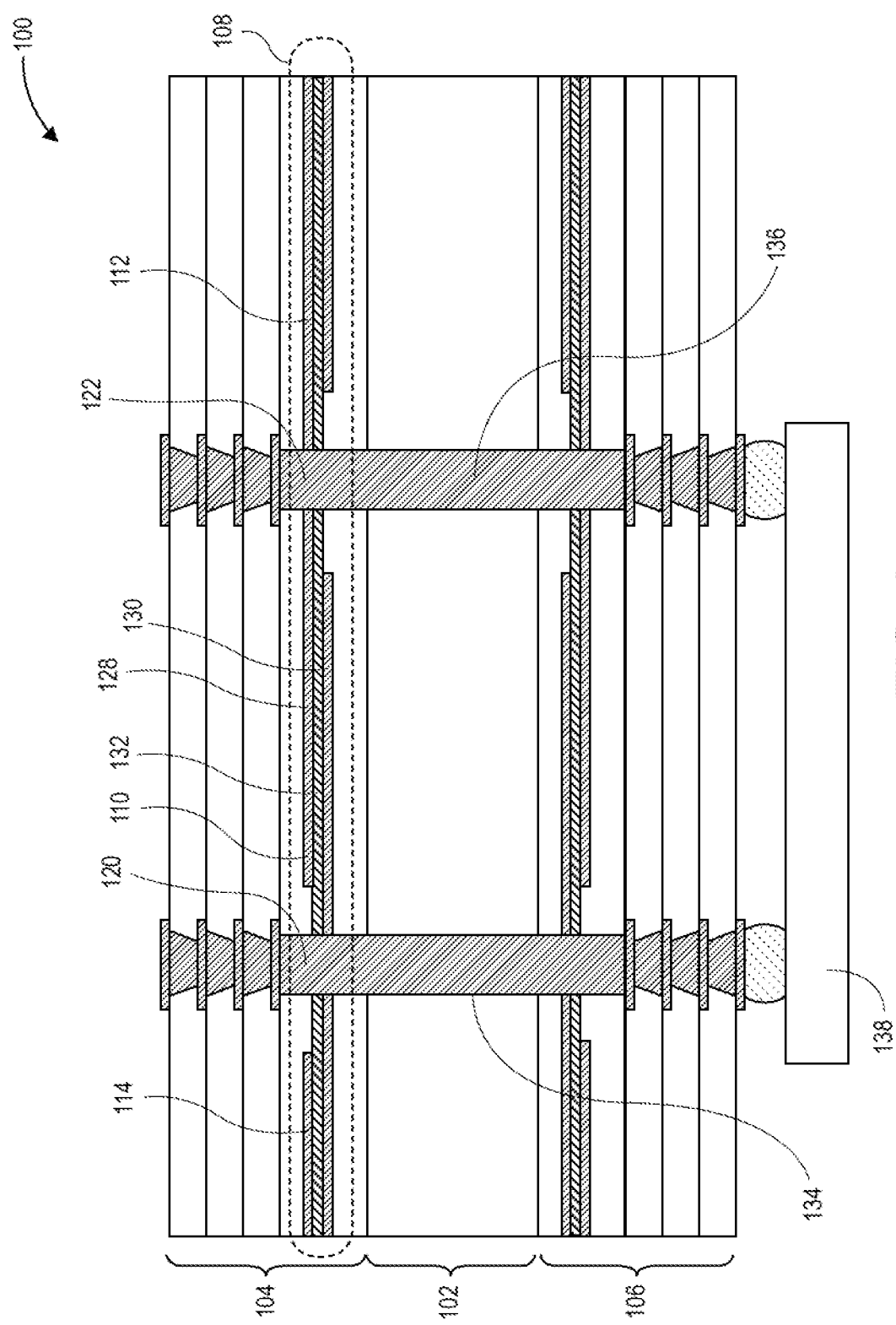
FIG. 1 is an example diagram of a legacy substrate that includes capacitors within a buildup layer and discrete capacitors coupled with the substrate.

Embodiments described herein may be related to apparatuses, processes, and techniques for embedding thin-film capacitors in TGVs within a glass core of a substrate. In embodiments, the TGVs within a glass core may extend entirely from a first side of the glass core to a second side of the glass core opposite the first side. In embodiments, the TGVs may be implemented as blind vias that extend from the first side of the glass core toward the second side of the glass core but not fully reaching the second side. In embodiments, the TGVs may have a circular or oval shape, or may be implemented as trenches or may be implemented as some other irregular shape.

In embodiments, layers of electrically conductive material electrically isolated by layers of dielectric material may be inserted into the TGV to create capacitors. These layers of electrically conductive material and dielectric material may be referred to as thin-film capacitors (TFC). The capacitors may then be electrically coupled with various electrical sources, such as with a Vss or Vdd using a redistribution layer (RDL) or a buildup layer containing electrically conductive routing features that are electrically and/or physically coupled with the first side of the glass core or the second side of the glass core.

Embodiments described herein may facilitate increased capacitance density within a package while reducing the overall footprint of a package. This reduction may be accomplished by moving legacy capacitors that would be otherwise placed within a horizontal buildup layer of a package into vertically oriented capacitors within a glass substrate. These legacy capacitors within a buildup layer take up a large amount of space due to their horizontal orientation with respect to the core of the substrate, while adding additional capacitors necessitates the lengthening of the package.

In embodiments, the resulting reduction in footprint size of a package may be accomplished by reducing the number of discrete capacitor components electrically coupled with bump layers on a package. In embodiments described herein, atomic layer deposition (ALD) techniques may be used for extending the deposition of TFC materials into high aspect ratio TGVs within glass cores or glass substrates.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 is an example diagram of a legacy substrate that includes capacitors within a buildup layer and discrete capacitors coupled with the substrate. Legacy substrate 100 includes a core 102, which may be an organic core or a copper clad laminate (CCL) core, with a first buildup layer 104 above the core 102, and a second buildup layer 106 below the core 102. The first buildup layer 104 and the second buildup layer 106 include multiple sublayers as shown, which may include multiple metallization layers for routing that are separated by dielectric layers.

In legacy implementations, a capacitor layer 108 may be located within the first buildup layer 104. A Vdd source 120 and a Vss source 122 may be electrically coupled with one or more capacitors 110, 112, 114 within the capacitor layer 108. In implementations, the capacitors 110, 112, 114 may include a first conductive layer such as layer 128 that is electrically coupled with the Vss source 122, a second conductive layer such as layer 130 that is electrically coupled with the Vdd source 120, and a dielectric layer 132 that electrically isolates the first conductive layer 128 and the second conductive layer 130. Characteristics of the one or more capacitors 110, 112, 114 may be altered based on the length of the first conductive layer 128 and the second conductive layer 130, and the width, length, and material used in the dielectric layer 132.

The Vdd source 120 may be implemented as an electrically conductive feature 134, such as a through core via, that is electrically coupled at a side of the first buildup layer 104 and/or a side of the second buildup layer 106. Similarly, the Vss source 122 may be implemented as an electrically conductive feature 136, such as a through core via, that is electrically coupled at a side of the first buildup layer 104 and/or a side of the second buildup layer 106.

As shown, the legacy capacitors 110, 112, 114 take up a large amount of horizontal space above the core 102. As a result, this architecture may extend the width of the substrate 100, may increase the number of layers required within the first buildup 104, and may limit the density of components within the substrate, such as the electrically conductive features 134, 136. In legacy implementations, capacitors may also be implemented in the second buildup layer 106 (not shown).

In addition, legacy discrete components, such as capacitor 138, may be located on an edge of a buildup layer, for example, the second buildup layer 106. Here, the capacitor 138 may be electrically coupled with the Vss source 120 and the Vdd source 122. Although this legacy architecture may allow a higher density of components within the substrate, it requires additional height added to the overall substrate 100. Also, it may move the capacitive function further away from areas within the substrate 100 that require the function, and may result in a costlier overall substrate for manufacture.

Figure 2:
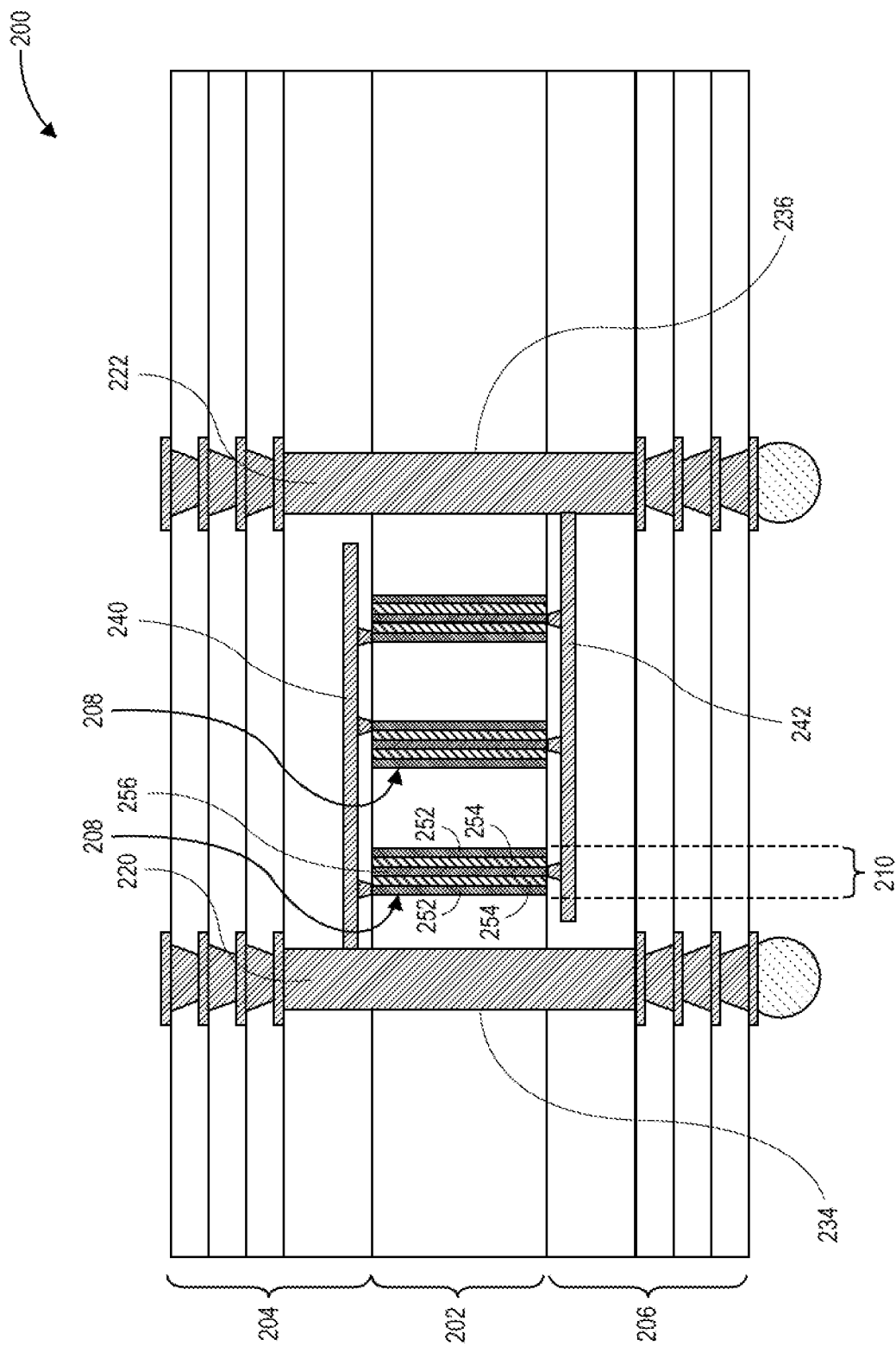
FIG. 2 illustrates a substrate that includes a glass core with a plurality of through glass vias (TGV) that include thin-film capacitors, in accordance with various embodiments.

FIG. 2 illustrates a substrate that includes a glass core with a plurality of TGVs that include thin-film capacitors, in accordance with various embodiments. Substrate 200 shows a cross-section side view of a substrate that includes a glass core 202, a first buildup layer 204, and a second buildup layer 206, which may be similar to glass core 102, first buildup layer 104, and second buildup layer 106 of FIG. 1. In embodiments, the first buildup layer 204 and/or the second buildup layer 206 may be redistribution layers that are on a first surface of the glass core 202, or with a second surface of the glass core 202 opposite the first surface. The first buildup layer 204 and the second buildup layer 206 may include multiple sublayers as shown, in particular metallization layers for electrical routing that may be separated by layers of dielectric material.

One or more TGV 208 may extend through the glass core 202. In embodiments, the TGV 208 may be filled with TFC layers, in particular a first conductive layer 252 and a second conductive layer 256, and a dielectric layer 254. In embodiments, the conductive layer and the dielectric layer may be film layers. In embodiments, the first conductive layer 252 and the second conductive layer 256 are electrically isolated by the dielectric layer 254.

A Vdd source 220 and a Vss source 222 may be electrically coupled with one or more capacitors 210. In particular, the Vdd source 220 may be electrically coupled with a Vdd routing layer 240, which in turn may be electrically coupled with the first conductive layer 252. The Vss source 222 may be electrically coupled with a Vss routing layer 242, which in turn may be electrically coupled with the second conductive layer 256.

The Vdd source 220 may be implemented as an electrically conductive feature 234, such as a TGV filled with conductive material, that is electrically coupled at a side of the first buildup layer 204 and/or a side of the second buildup layer 206. Similarly, the Vss source 222 may be implemented as an electrically conductive feature 236, such as a TGV filled with conductive material, that is electrically coupled at a side of the first buildup layer 204 and/or a side of the second buildup layer 206.

As shown with respect to substrate 200, the Vdd 220 and the Vss 222 are electrically coupled to the first conductive layer 252 and the second conductive layer 256 of the one or more capacitors 210 at opposite ends of the capacitors. In other embodiments, the Vdd routing layer 240 and the Vss routing layer 242 may be on the same side of the glass core 202, thus electrical coupling may happen at the same ends of the one or more capacitors 210 (not shown).

Figure 3A:
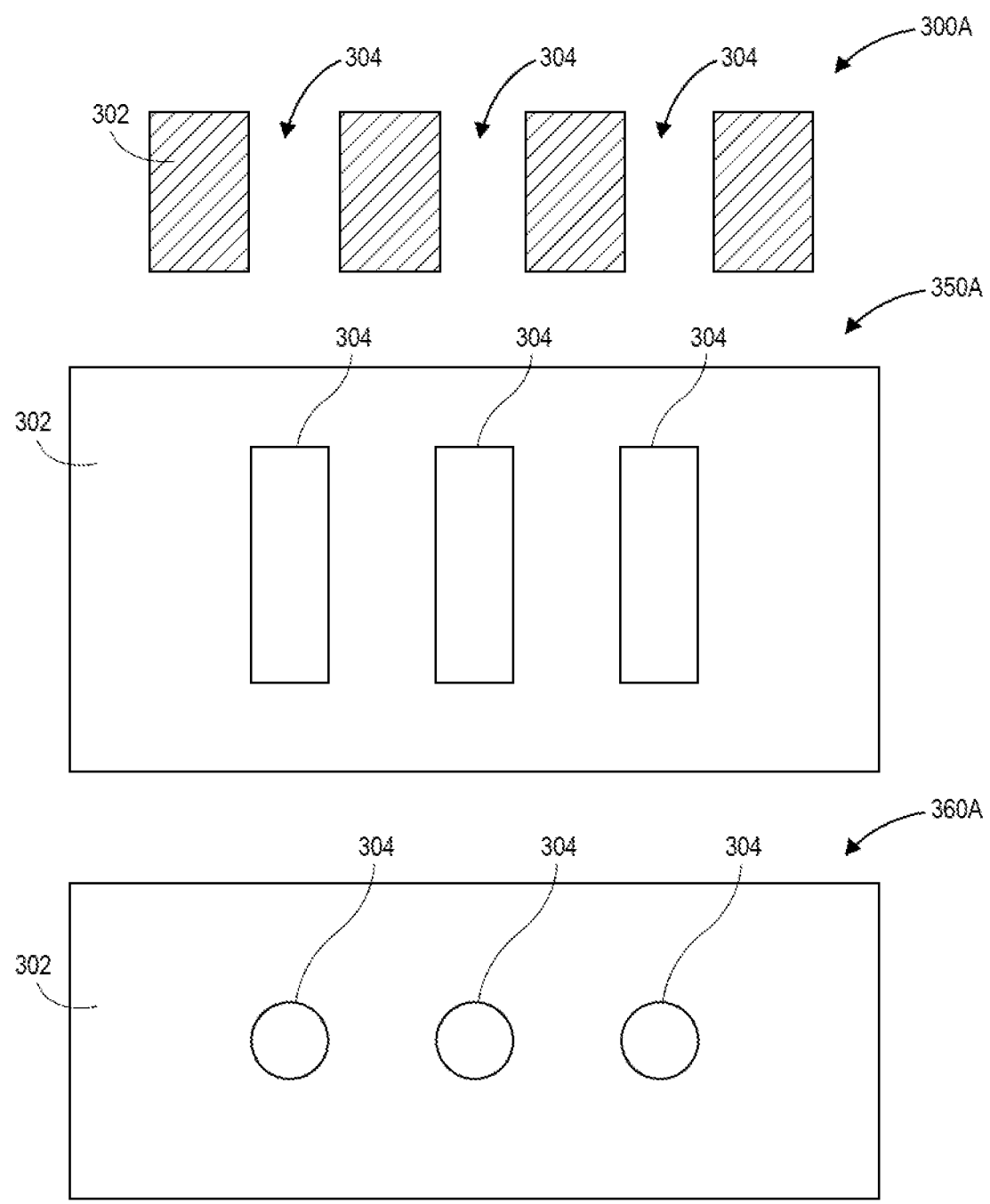
FIGS. 3A-3E illustrate stages in a manufacturing process for creating thin-film capacitors within a TGV, in accordance with various embodiments.

FIGS. 3A-3E illustrate stages in a manufacturing process for creating thin-film capacitors within a TGV in a glass core, in accordance with various embodiments. FIG. 3A shows a stage in the manufacturing process that identifies a glass core and creates one or more TGVs within a glass core. Diagram 300A shows a cross-section side view of a glass core 302, with a plurality of TGVs 304 formed within the glass core 302, which may be similar to glass core 202 and TGV 208 of FIG. 2. In embodiments, these TGVs 304 may be created using the techniques described with respect to FIG. 8 below. Diagram 350A shows a top-down view where the TGVs 304 have a rectangular shape that extend through the glass core 302. Diagram 360A shows a top-down view where the TGVs 304 have a circular shape. In embodiments, the TGVs 304 may have any shape that may be chosen with respect to the capacitive characteristics being sought.

Figure 3B:
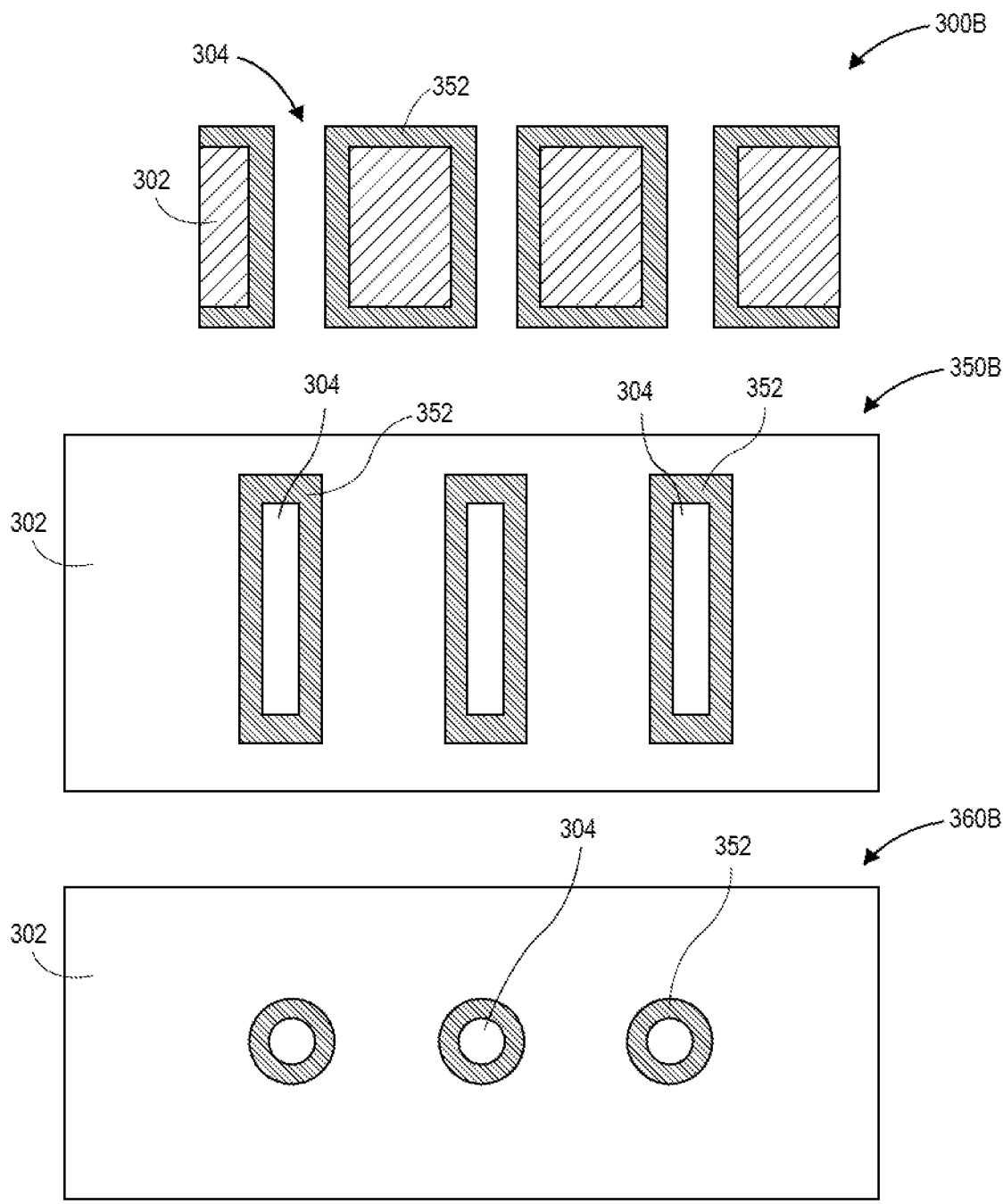

FIG. 3B shows a stage in the manufacturing process where a first electrically conductive layer is formed within the TGVs. Diagram 300B shows a cross section side view of the glass core 302, where a first electrically conductive layer 352 is deposited on the glass core 302 and within the TGVs 304. In embodiments, this first electrically conductive layer 352 may be a metal layer that may be deposited using a deposition technique that may include electroless deposition, physical vapor deposition (PVD), chemical vapor deposition (CVD), atomic layer deposition (ALD), and/or electrolytic plating. In embodiments, the ALD process may be preferred for higher aspect ratio TGVs 304. Diagram 350B shows a top-down view of the center of the glass core where the first electrically conductive layer 352 is applied to the sides of the TGV 304 that have a rectangular shape. Diagram 360B shows a top-down view of the center of the glass core where the first electrically conductive layer 352 is applied to the sides of the TGV 304 that have a circular shape.

In embodiments, the electrically conductive layer 352 may include copper or other low resistivity metals, which may also be used for Vss and Vdd metallization. Iridium (Ir), iridium oxide, ruthenium (Ru), ruthenium oxide, and the like may also be used for a contact metal.

Figure 3C:
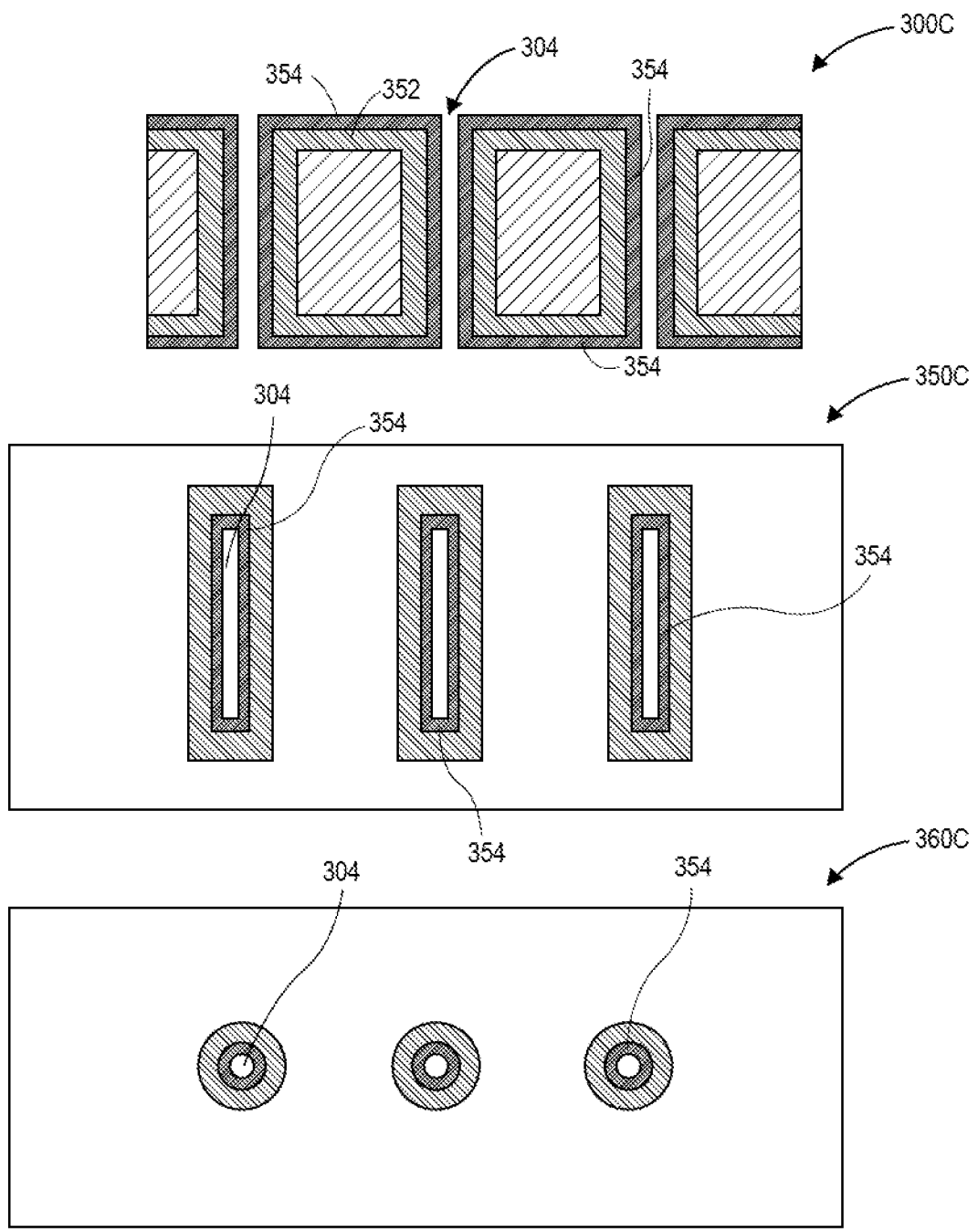

FIG. 3C shows a stage in the manufacturing process where a dielectric layer, which may also be referred to as a stack layer, is applied onto the first electrically conductive layer. Diagram 300C shows a cross-section side view where a dielectric layer 354 is deposited on the first electrically conductive 352 within the TGV 304. In embodiments, the dielectric layer may include titanium oxide (TiO2), hafnium oxide (HfO2), hertzium oxide (HzO), aluminum oxide (Al2O3) and the like.

In embodiments, the dielectric layer 354 may include multiple dielectric layers, and may include nanolaminated stacks within these multiple dielectric layers. Thicknesses of the dielectric layers may be chosen based upon an equivalent series resistance (ESR), voltage, or other desired capacitive performance attributes. Diagram 350C and diagram 360C show top-down views of the glass core with TGVs 304 that are rectangular and circular, respectively.

Figure 3D:
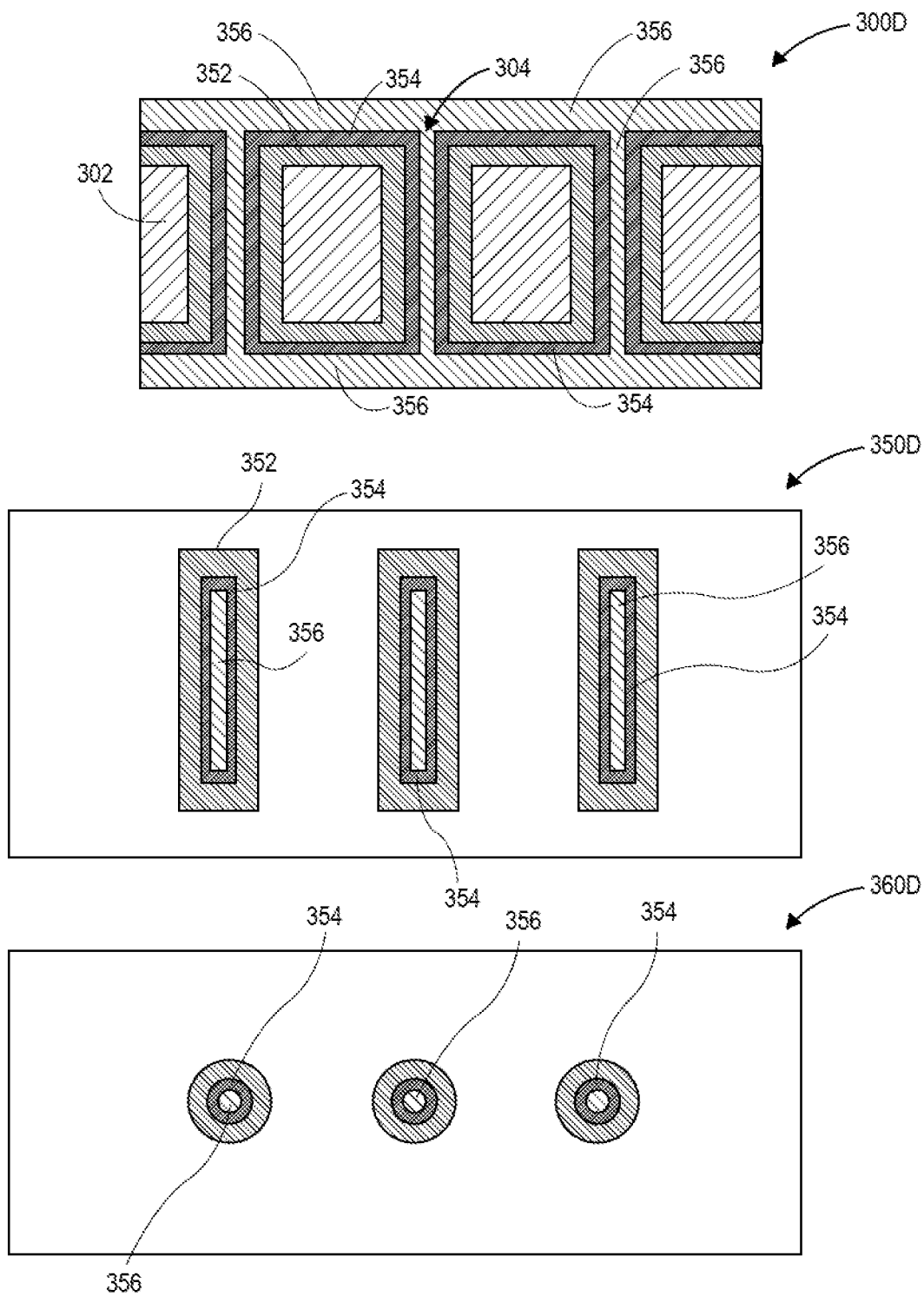

FIG. 3D shows a stage in the manufacturing process where a second electrically conductive layer is applied to the dielectric layer. Diagram 300D is a cross-section side view that shows a second electrically conductive layer 356 applied to the dielectric layer 354. As shown, the second electrically conductive layer may be applied to the top of the glass layer 302 in addition to within the TGV 304. In embodiments, the second electrically conductive layer 356 may be referred to as a metallization, and have characteristics similar to the first electrical conductive layer 352.

In embodiments, the second electrically conductive layer 356 may entirely fill the volume within the TGV 304 between the dielectric layer 354, while in other embodiments there may be a gap between the second electrically conductive layer 356 within the TGV 304. In other embodiments, additional layers, for example additional layers of first electrically conductive material, dielectric material, and second electrically conductive material may be repeatedly applied to enable higher capacitance densities for each TGV 304. Diagram 350D and diagram 360D show top-down views of the glass core with TGVs 304 that are rectangular and circular, respectively.

Figure 3E:
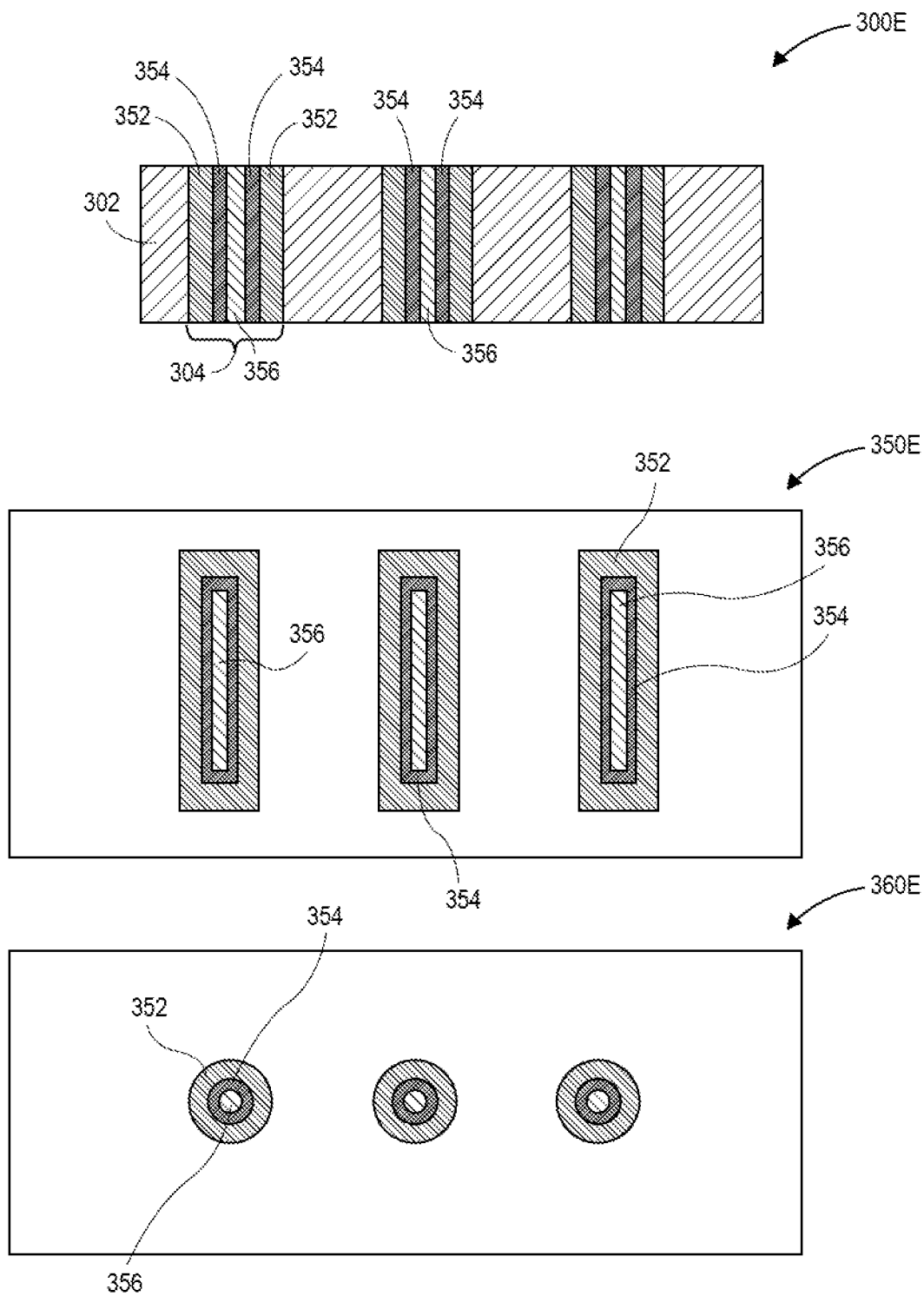

FIG. 3E shows a stage in the manufacturing process where planarization is performed to remove excess material on the first and the second side of the glass core 302.

Diagram 300E shows a cross-section side view of a final planarized glass core 302 with TGVs 304 that include a capacitor that has a first electrically conductive layer 352, a dielectric layer 354, and a second electrically conductive layer 356. Diagram 350E and diagram 360E show top-down views of the glass core with TGVs that are rectangular and circular, respectively. In embodiments, instead of planarization, lithography and etch may be used to remove excess material on the first and the second side of the glass core 302.

Note that with respect to FIG. 3A-3E, any TGVs 304 that are not to have capacitors built in them may be filled prior to the process of FIG. 3A-3E. The TSVs may be filled, for example, with a resist or a protection film, which may be removed subsequent to the formation of the capacitors in the glass substrate 302.

Figure 4:
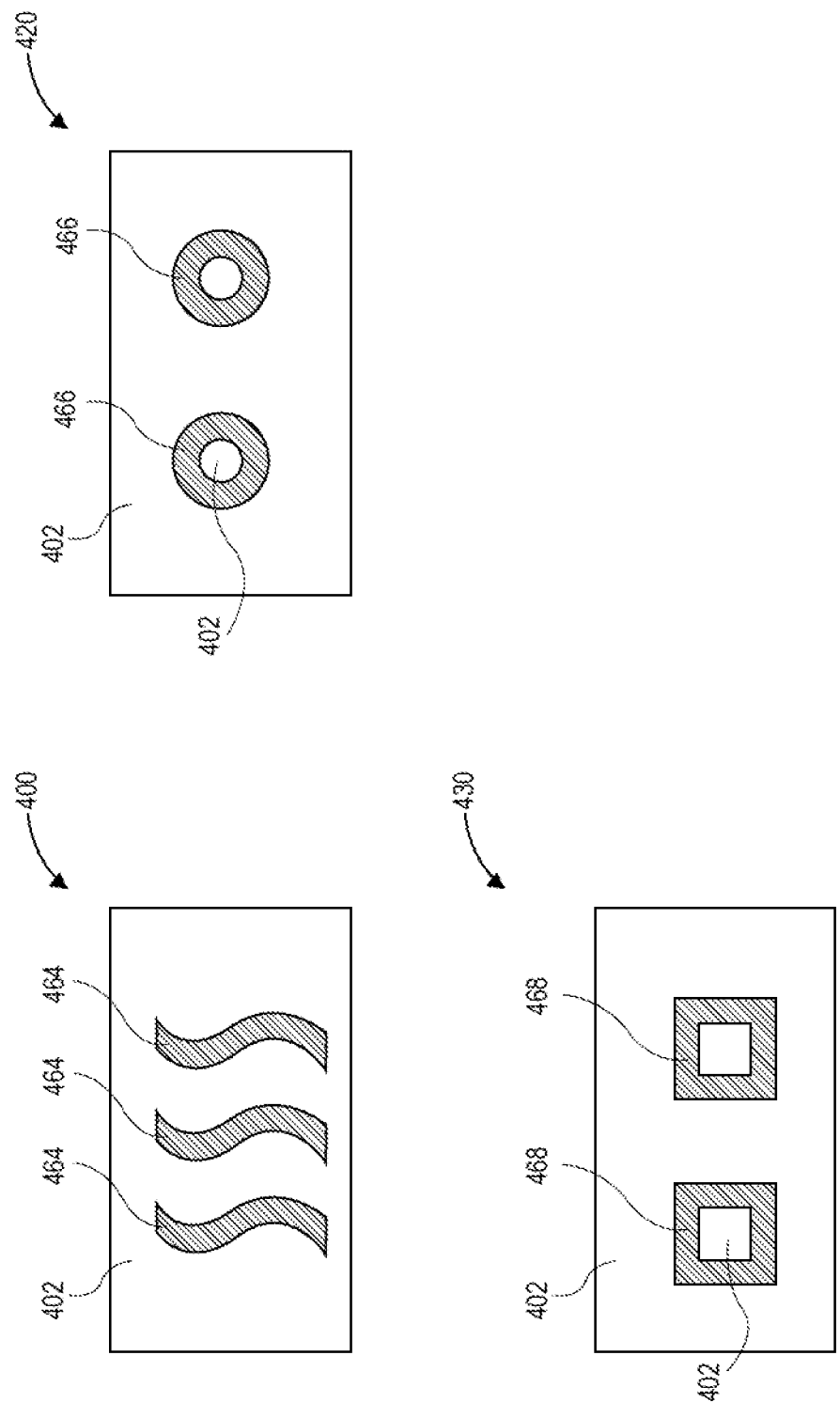
FIG. 4 illustrates top-down views of various shapes of TGV within a glass core, in accordance with various embodiments.

FIG. 4 illustrates top-down views of various shapes of TGV within a glass core, in accordance with various embodiments. Diagram 400 shows an example of a top-down view of a glass core 402 that includes three capacitors 464 that are formed using an "S" shape for a TGV. Diagram 420 shows an example of a top-down view of the glass core 402 that includes two capacitors 466 that are formed in a ring shape, with a glass core 402 in the center of the ring shaped capacitors 466. Similarly, diagram 430 shows an example of a top-down view of a glass core 402 that includes two capacitors that are formed in a square shape, with a glass core 402 in the center of the square shaped capacitors 468. These are just a few examples of the geometries of capacitors that may be formed using the techniques described herein. For diagrams 420 and 430, the glass core 402 features within the capacitors 466, 468 may be formed by initially creating blind vias within a glass substrate and applying the first electrically conductive layer, the dielectric layer, and the second conductive layer as described above with respect to FIG. 3A-3E, and then planarizing the side of the glass layer to expose the conductive elements to both sides of the glass layer.

Figure 5:
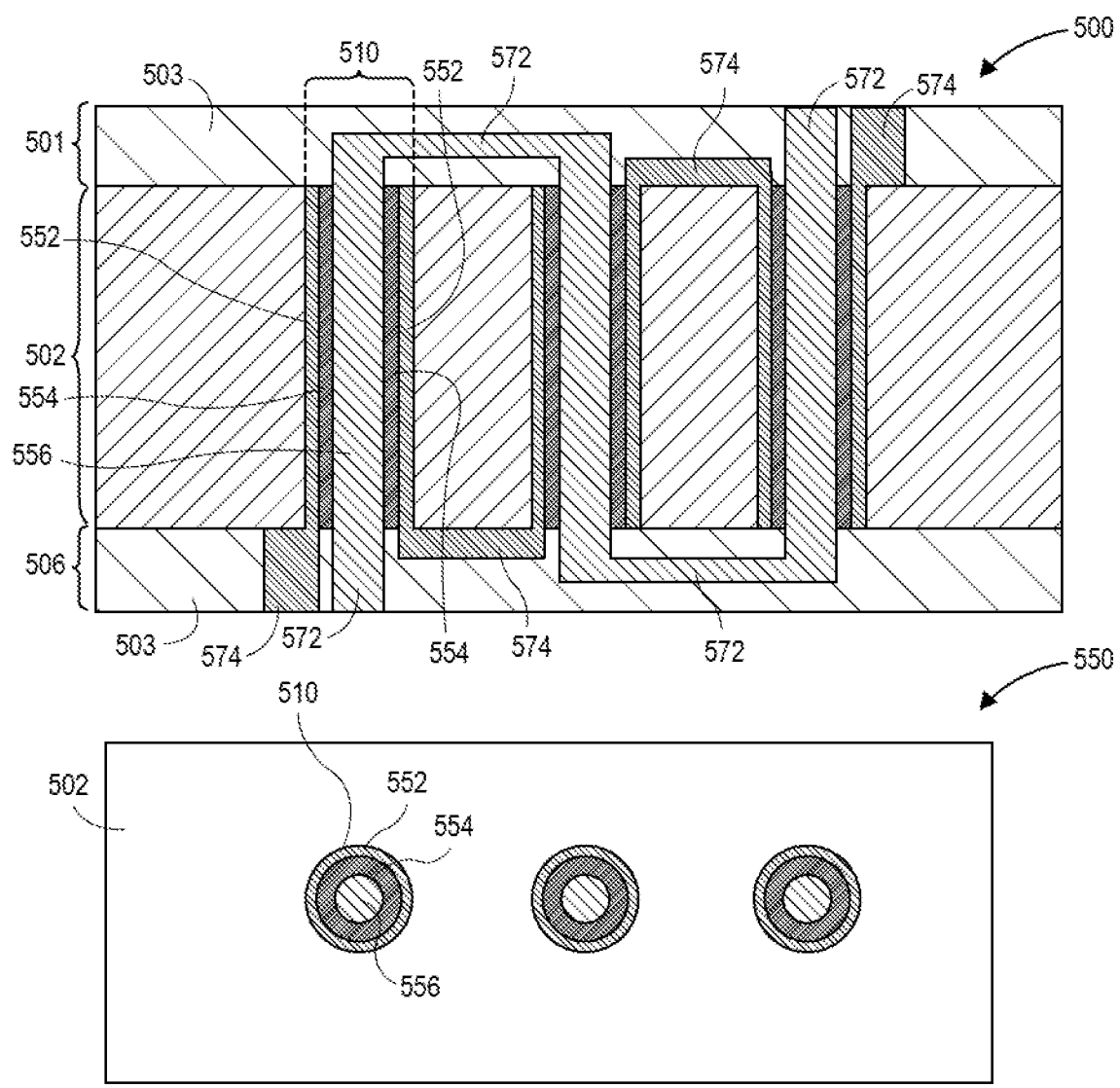
FIG. 5 illustrates a side view and top-down cross-section view of a glass core with a plurality of thin-film capacitors within TGVs that are electrically coupled with each other, in accordance with various embodiments.

FIG. 5 illustrates a side view and top-down cross-section view of a glass core with a plurality of thin-film capacitors within TGVs that are electrically coupled with each other, in accordance with various embodiments. Substrate 500 is a cross-section side view that includes a glass core 502, with a first buildup layer 501 on a first side of the glass core 502, and a second buildup layer 506 on the second side of glass core 502. Substrate 500 may be similar to substrate 200 of FIG. 2.

A plurality of capacitors 510 are shown, which may be similar to capacitors 210 of FIG. 2. The capacitors 510 include a first electrically conductive layer 552, a dielectric layer 554, and a second electrically conductive layer 556, which may be similar to the first electrically conductive layer 352, dielectric layer 354, and second electrically conductive layer 356 of FIG. 3E.

A Vdd electrical routing 572 within the first buildup layer 501 and within the second buildup layer 506 is electrically coupled with the second electrically conductive layer 556. A Vss electrical routing 574 within the first buildup layer 501 and within the second buildup layer 506 is electrically coupled with the first electrically conductive layer 552. The Vdd electrical routing 572 is electrically isolated from the Vss electrical routing 574 by the dielectric layer 554 within the capacitor 510, as well as by the dielectric material 503 within the first buildup layer 501 and the second buildup layer 506. Diagram 550 shows a top-down view of the center of the glass core, in accordance with embodiments.

Figure 6:
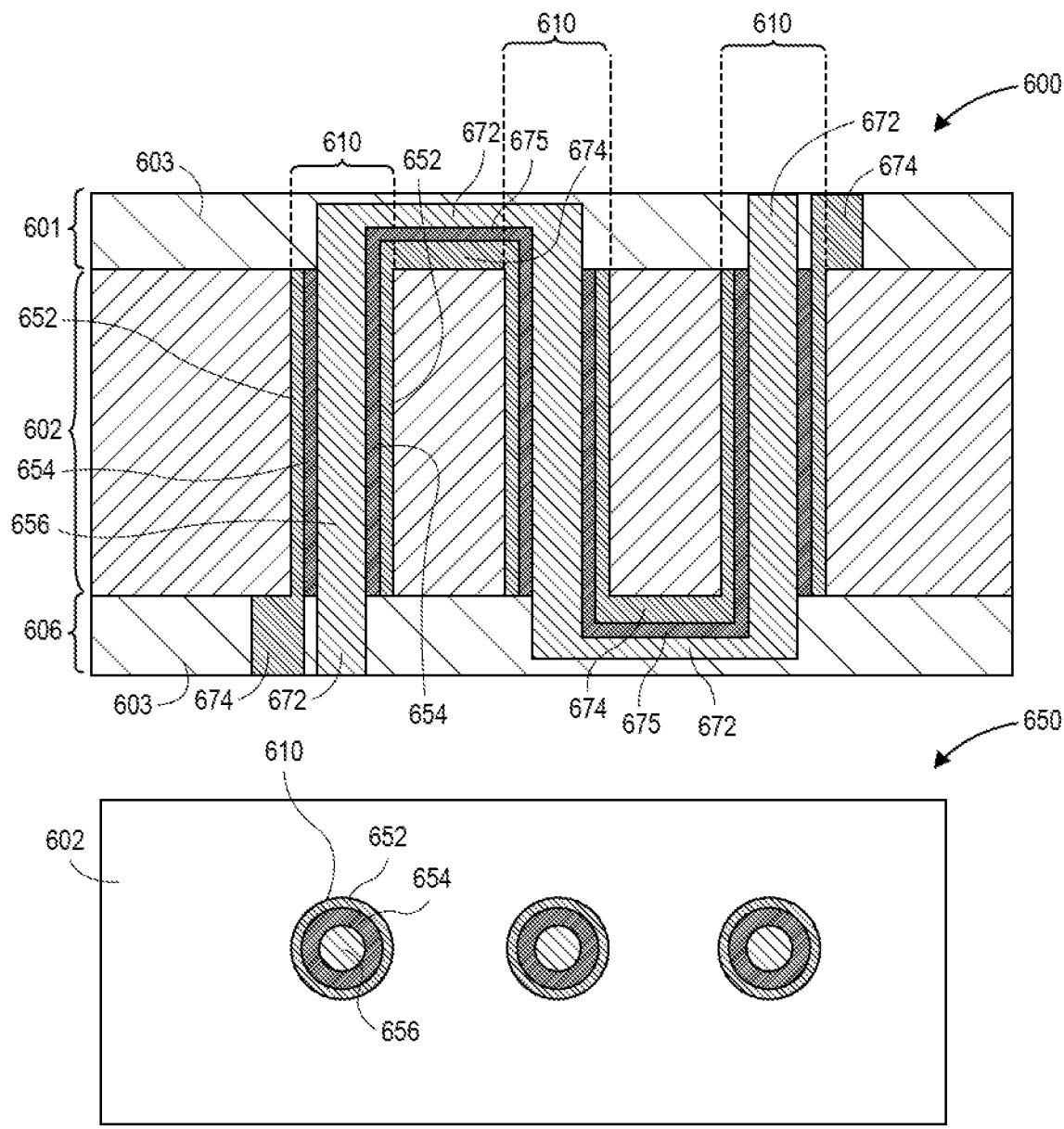
FIG. 6 illustrates a side view and top-down cross-section view of another glass core with a plurality of thin-film capacitors within TGVs that are electrically coupled with each other, in accordance with various embodiments.

FIG. 6 illustrates a side view and top-down cross-section view of another glass core with a plurality of thin-film capacitors within TGVs that are electrically coupled with each other, in accordance with various embodiments. Substrate 600 is a cross-section side view that includes a glass core 602, with a first buildup layer 601 on a first side of the glass core 602, and a second buildup layer 606 on the second side of glass core 602. Substrate 600 may be similar to substrate 500 of FIG. 5.

A plurality of capacitors 610 are shown, which may be similar to capacitors 510 of FIG. 5. The capacitors 610 include a first electrically conductive layer 652, a dielectric layer 654, and a second electrically conductive layer 656, which may be similar to the first electrically conductive layer 552, dielectric layer 554, and second electrically conductive layer 556 of FIG. 5.

A Vdd electrical routing 672 within the first buildup layer 601 and within the second buildup layer 606 is electrically coupled with the second electrically conductive layer 656. A Vss electrical routing 674 within the first buildup layer 601 and within the second buildup layer 606 is electrically coupled with the first electrically conductive layer 652. Note that unlike substrate 500 of FIG. 5, the dielectric layer 654 extends up into the buildup layers 601, 606 to electrically isolate, in addition to the dielectric material 603 in the first buildup layer 601 and the second buildup layer 606, the Vdd electrical routing 672 from the Vss electrical routing 674. Diagram 650 shows a top-down view of a cross-section of the center of the glass core, in accordance with embodiments.

Figure 7:
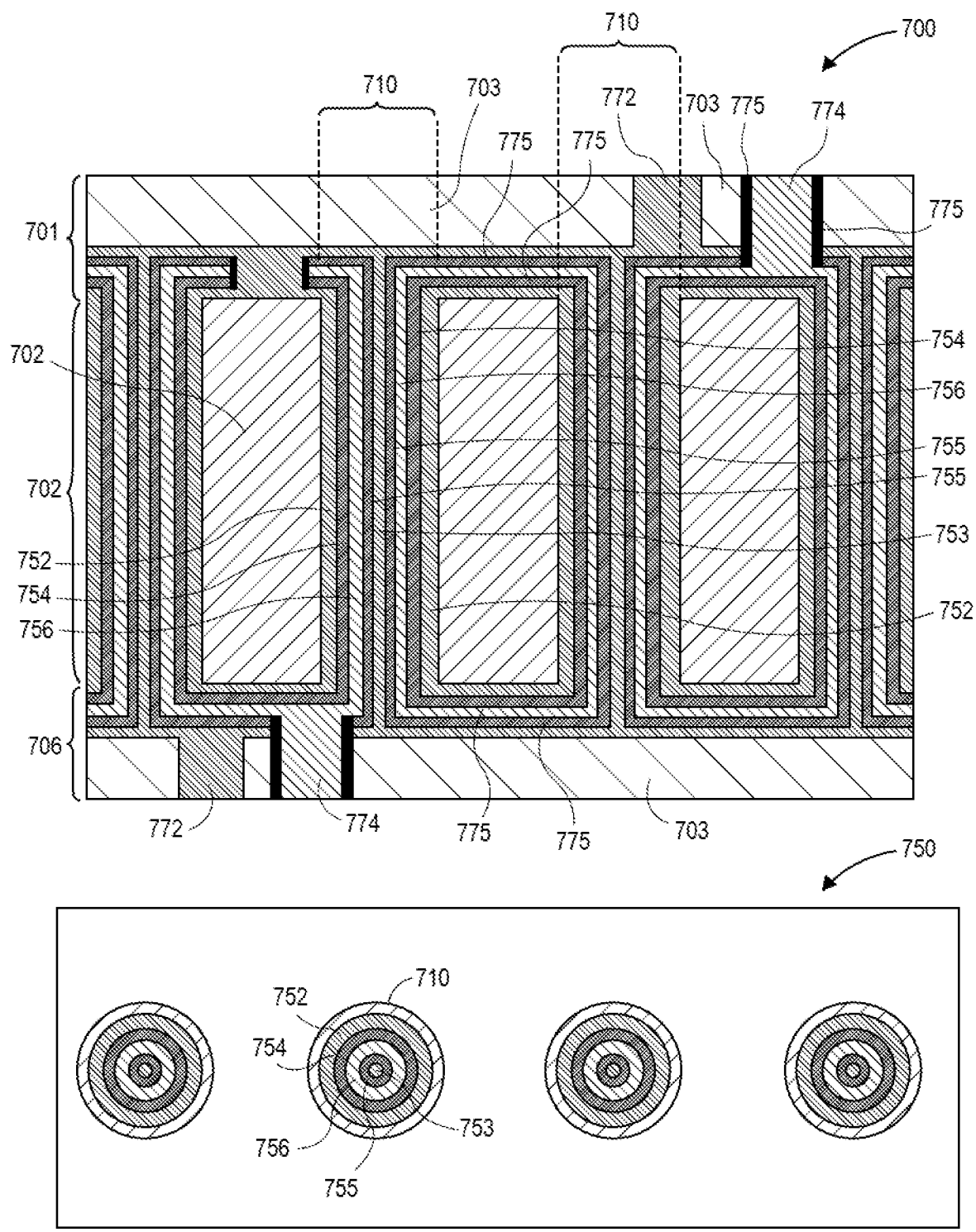
FIG. 7 illustrates a side view and top-down cross-section view of multiple thin-film layers of a capacitor within multiple TGVs, in accordance with various embodiments.

FIG. 7 illustrates a side view and top-down cross-section view of multiple thin-film layers of a capacitor within multiple TGVs, in accordance with various embodiments. Substrate 700 is a cross-section side view that includes a glass core 702, with a first buildup layer 701 on a first side of the glass core 702, and a second buildup layer 706 on the second side of glass core 702. Substrate 700 may be similar to substrate 600 of FIG. 6.

A plurality of capacitors 710 are shown, which may be similar to capacitors 610 of FIG. 6. The capacitors 710 include a first electrically conductive layer 752, a first dielectric layer 754, and a second electrically conductive layer 756, a second dielectric layer 755, and a third electrically conductive layer 753 that is electrically coupled with the first electrically conductive layer 752.

A Vdd electrical routing 772 within the first buildup layer 701 and within the second buildup layer 706 is electrically coupled with the first electrically conductive layer 752 and with the third electrically conductive layer 753. A Vss electrical routing 774 within the first buildup layer 701 and within the second buildup layer 706 is electrically coupled with the second electrically conductive layer 754. Note that similar to substrate 600 of FIG. 6, the dielectric layers 754, 755 extend into the buildup layers 701, 706 to electrically isolate, in addition to the dielectric material 703 in the first buildup layer 701 and the second buildup layer 706, the Vdd electrical routing 772 from the Vss electrical routing 774. Diagram 750 shows a top-down view of the center of the glass core, in accordance with embodiments.

Figure 8:
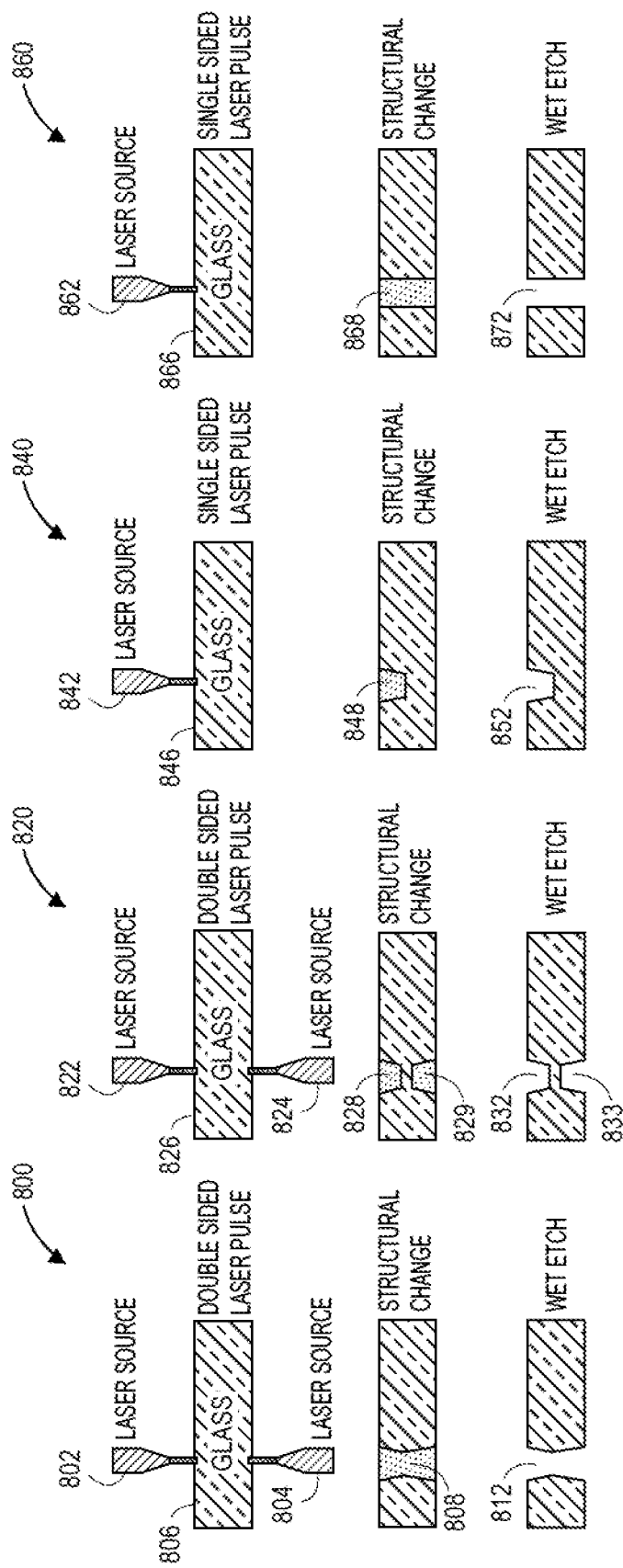
FIG. 8 illustrates multiple examples of laser-assisted etching of glass interconnects processes, in accordance with various embodiments.

FIG. 8 illustrates multiple examples of laser-assisted etching of glass interconnects processes, in accordance with various embodiments. FIG. 8 illustrates multiple examples of laser-assisted etching of glass interconnects processes (which may be referred to as "LEGIT" herein), in accordance with embodiments. One use of the LEGIT technique is to provide an alternative substrate core material to the legacy copper clad laminate (CCL) core used in semiconductor packages used to implement products such as servers, graphics, clients, 5G, and the like. By using laser-assisted etching, crack free, high density via drills, hollow shapes may be formed into a glass substrate. In embodiments, different process parameters may be adjusted to achieve drills of various shapes and depths, thus opening the door for innovative devices, architectures, processes, and designs in glass. Embodiments, such as the bridge discussed herein, may also take advantage of these techniques.

Diagram 800 shows a high level process flow for a through via and blind via (or trench) in a microelectronic package substrate (e.g. glass) using LEGIT to create a through via or a blind via. A resulting volume/shape of glass with laser-induced morphology change that can then be selectively etched to create a trench, a through hole or a void that can be filled with conductive material. A through via 812 is created by laser pulses from two laser sources 802, 804 on opposite sides of a glass wafer 806. As used herein, a through drill and a through via refers to when the drill or the via starts on one side of the glass/substrate and ends on the other side. A blind drill and a blind via refers to when the drill or the via starts on the surface of the substrate and stops half way inside the substrate. In embodiments, the laser pulses from the two laser sources 802, 804 are applied perpendicularly to the glass wafer 806 to induce a morphological change 808, which may also be referred to as a structural change, in the glass that encounters the laser pulses. This morphological change 808 includes changes in the molecular structure of the glass to make it easier to etch out (remove a portion of the glass). In embodiments, a wet etch process may be used.

Diagram 820 shows a high level process flow for a double blind shape. A double blind shape 832, 833 may be created by laser pulses from two laser sources 822, 824, which may be similar to laser sources 802, 804, that are on opposite sides of the glass wafer 826, which may be similar to glass wafer 806. In this example, adjustments may be made in the laser pulse energy and/or the laser pulse exposure time from the two laser sources 822, 824. As a result, morphological changes 828, 829 in the glass 826 may result, with these changes making it easier to etch out portions of the glass. In embodiments, a wet etch process may be used.

Diagram 840 shows a high level process flow for a single-blind shape, which may also be referred to as a trench. In this example, a single laser source 842 delivers a laser pulse to the glass wafer 846 to create a morphological change 848 in the glass 846. As described above, these morphological changes make it easier to etch out a portion of the glass 852. In embodiments, a wet etch process may be used.

Diagram 860 shows a high level process flow for a through via shape. In this example, a single laser source 862 applies a laser pulse to the glass 866 to create a morphological change 868 in the glass 866, with the change making it easier to etch out a portion of the glass 872. As shown here, the laser pulse energy and/or laser pulse exposure time from the laser source 862 has been adjusted to create an etched out portion 872 that extends entirely through the glass 866.

With respect to FIG. 8, although embodiments show laser sources 802, 804, 822, 824, 842, 862 as perpendicular to a surface of the glass 806, 826, 846, 866, in embodiments, the laser sources may be positioned at an angle to the surface of the glass, with pulse energy and/or pulse exposure time variations in order to cause a diagonal via or a trench, or to shape the via, such as 812, 872, for example to make it cylindrical, tapered, or include some other feature. In addition, varying the glass type may also cause different features within a via or a trench as the etching of glass is strongly dependent on the chemical composition of the glass.

In embodiments using the process described with respect to FIG. 8, through hole vias 812, 872 may be created that are less than 10 μm in diameter, and may have an aspect ratio of 40:1 to 50:1. As a result, a far higher density of vias may be placed within the glass and be placed closer to each other at a fine pitch. In embodiments, this pitch may be 50 μm or less. After creating the vias or trenches, a metallization process may be applied in order to create a conductive pathway through the vias or trenches, for example a plated through hole (PTH). Using these techniques, finer pitch vias may result in better signaling, allowing more I/O signals to be routed through the glass wafer and to other coupled components such as a substrate.

Figure 9:
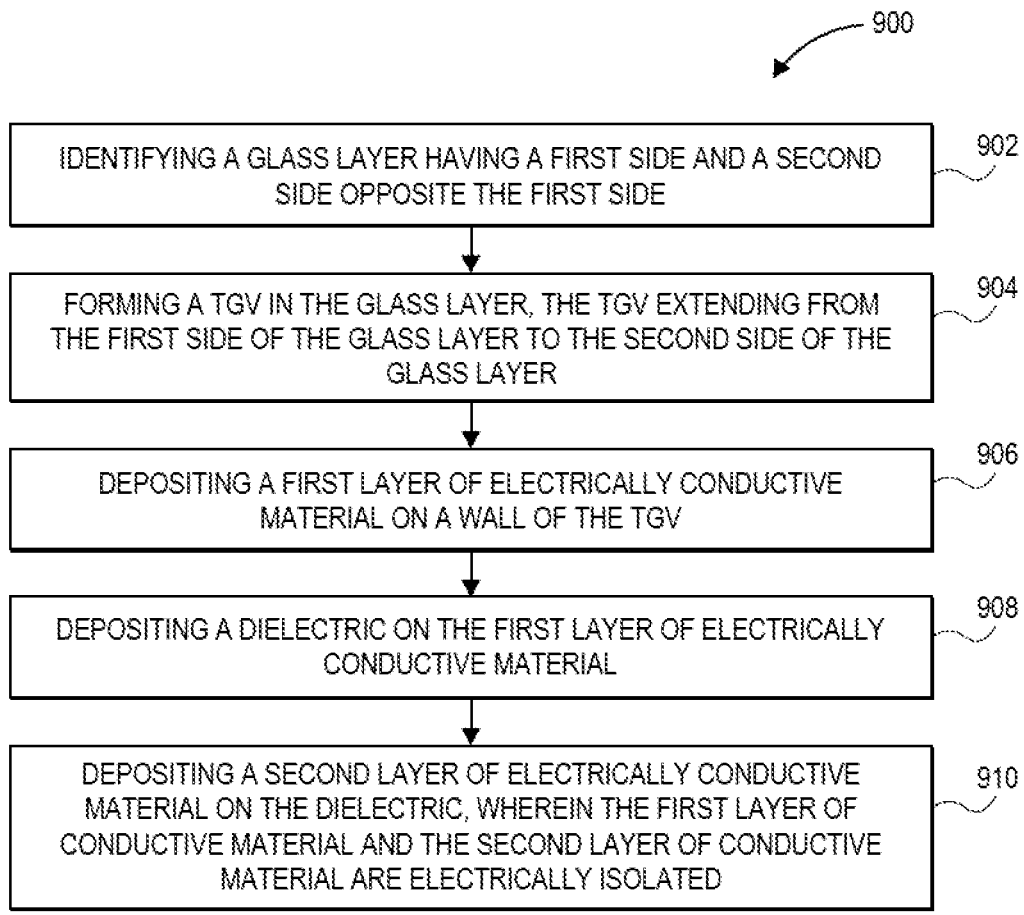
FIG. 9 illustrates an example of a process for creating a thin film a capacitor within a TGV in a glass core, in accordance with various embodiments.

FIG. 9 illustrates an example of a process for creating a thin film a capacitor within a TGV in a glass core, in accordance with various embodiments. Process 900 been implemented by apparatus, systems, techniques, or processes described herein, and in particular with respect to FIGS. 1-8

At block 902 the process may include identifying a glass layer having a first side and a second side opposite the first side.

At block 904, the process may further include forming a TGV in the glass layer, the TGV extending from the first side of the glass layer to the second side of the glass layer.

At block 906, the process may further include depositing a first layer of electrically conductive material on a wall of the TGV.

At block 908, the process may further include depositing a dielectric on the first layer of electrically conductive material.

At block 910, the process may further include depositing a second layer of electrically conductive material on the dielectric, wherein the first layer of conductive material and the second layer of conductive material are electrically isolated from each other.

Figure 10:
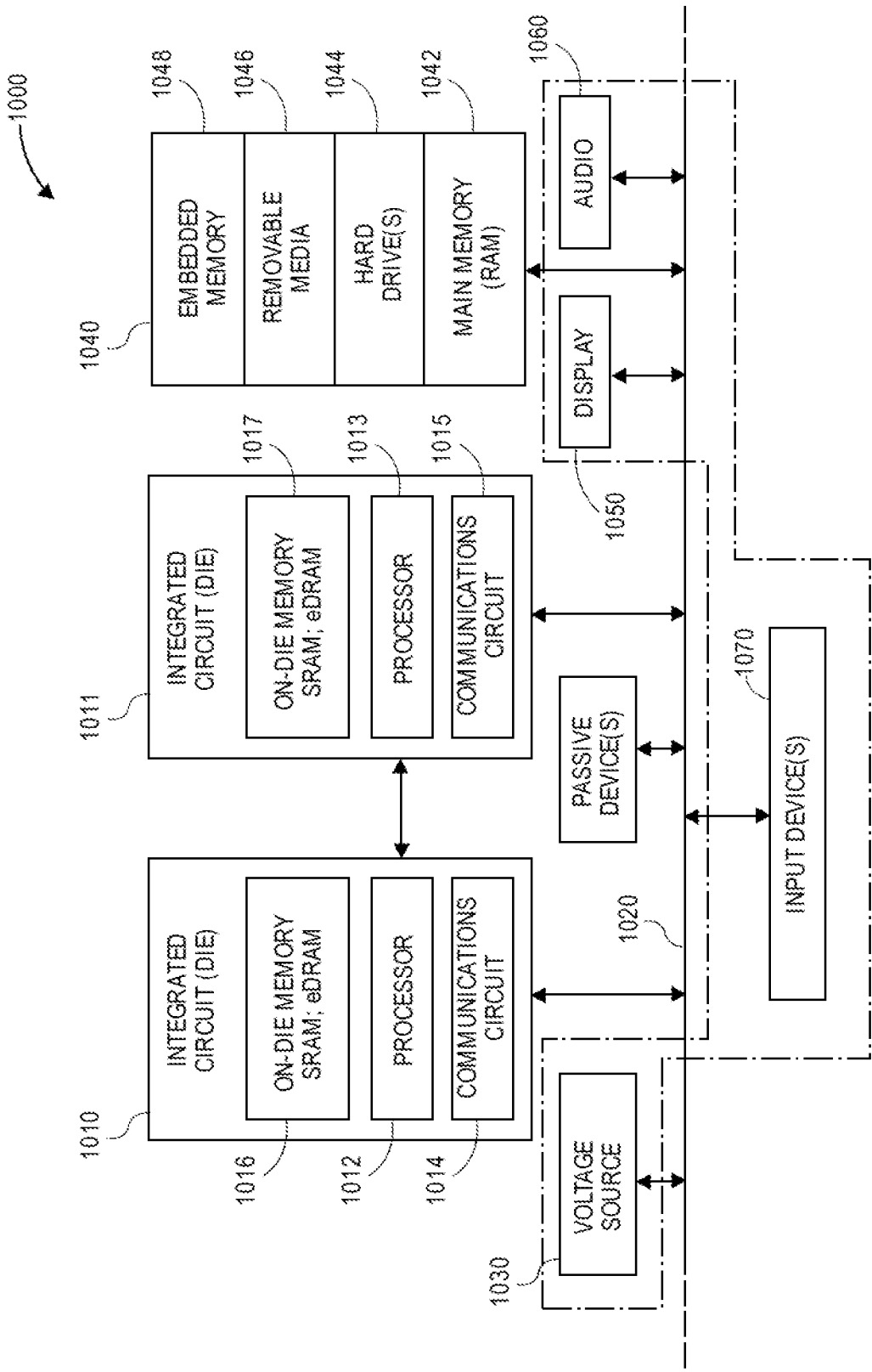
FIG. 10 schematically illustrates a computing device, in accordance with various embodiments.

FIG. 10 is a schematic of a computer system 1000, in accordance with an embodiment of the present invention. The computer system 1000 (also referred to as the electronic system 1000) as depicted can embody capacitors in through glass vias, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, capacitors in through glass vias, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a package substrate having capacitors in through glass vias, according to any of the several disclosed embodiments and their equivalents, an electronic system, a computer system, one or more methods of fabricating an integrated circuit, and one or more methods of fabricating an electronic assembly that includes a package substrate having capacitors in through glass vias, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having capacitors in through glass vias embodiments and their equivalents. A foundation substrate may be included, as represented by the dashed line of FIG. 10. Passive devices may also be included, as is also depicted in FIG. 10.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a capacitor comprising: a glass layer with a first side and a second side opposite the first side; a through glass via (TGV) that extends from the first side of the glass layer to the second side of the glass layer; a first conductive layer on a wall of the TGV; a dielectric layer on the first conductive layer within the TGV; and a second conductive layer on the dielectric layer within the TGV, wherein the first conductive layer and the second conductive layer are electrically isolated from each other.

Example 2 includes the capacitor of example 1, wherein a shape of the TGV at the first side of the glass layer is a selected one of: a circle, an oval, or a rectangle.

Example 3 includes the capacitor of example 1, wherein the TGV is a blind via that extends from the first side of the glass layer toward the second side of the glass layer.

Example 4 includes the capacitor of example 1, wherein the TGV is a plurality of TGVs.

Example 5 includes the capacitor of example 4, wherein the first conductive layer of a first TGV is electrically coupled with a first conductive layer of a second TGV; and wherein a second conductive layer of the first TGV is electrically coupled with a second conductive layer of the second TGV.

Example 6 includes the capacitor of example 1, wherein the first conductive layer or the second conductive layer includes a selected one of: copper, iridium, oxygen, aluminum, or ruthenium.

Example 7 includes the capacitor of example 1, wherein the dielectric layer includes a selected one of: titanium, hafnium, oxygen, or hertzium.

Example 8 includes the capacitor of any one of examples 1-7, further comprising a buildup layer on the first side of the glass layer or the second side of the glass layer, the buildup layer includes one or more electrical trace that is electrically coupled with the first conductive layer or the second conductive layer.

Example 9 is a method comprising: identifying a glass layer having a first side and a second side opposite the first side; forming a through glass via (TGV) in the glass layer, the TGV extending from the first side of the glass layer to the second side of the glass layer; depositing a first layer of electrically conductive material on a wall of the TGV; depositing a dielectric on the first layer of electrically conductive material; and depositing a second layer of electrically conductive material on the dielectric, wherein the first layer of conductive material and the second layer of conductive material are electrically isolated from each other.

Example 10 includes the method of example 9, wherein depositing the first layer of electrically conductive material or depositing the second layer of electrically conductive material further includes depositing using an atomic layer deposition (ALD) process.

Example 11 includes the method of example 9, wherein depositing the dielectric further includes depositing the dielectric using an ALD process.

Example 12 includes the method of example 9, wherein the TGV has an aspect ratio of greater than 8.

Example 13 includes the method of any one of examples 9-12, wherein the dielectric is a first dielectric; and further comprising: depositing a second dielectric on the second layer of electrically conductive material; and depositing a third layer of electrically conductive material on the second dielectric, wherein the third layer of electrically conductive material is electrically isolated from the second layer of electrically conductive material, and wherein the first layer of electrically conductive material is electrically coupled with the third layer of electrically conductive material.

Example 14 includes the method of example 9, further comprising: forming a buildup layer on the first side of the glass layer, the buildup layer including a plurality of electrical traces, wherein at least one of the plurality of electrical traces is electrically coupled with the first layer of electrically conductive material.

Example 15 includes the method of example 14, wherein the buildup layer is a first buildup layer and wherein the plurality of electrical traces is a first plurality of electrical traces; and further comprising: forming a second buildup layer on the second side of the glass layer, the second buildup layer including a plurality of second electrical traces, wherein at least one of the plurality of second electrical traces is electrically coupled with the second layer of the electrically conductive material.

Example 16 is a package comprising: a glass core with a first side and a second side opposite the first side, the glass core including: a TGV that extends from the first side of the glass core to the second side of the glass core; a first conductive layer on a wall of the TGV; a dielectric layer on the first conductive layer within the TGV; and a second conductive layer on the dielectric layer within the TGV, wherein the first conductive layer and the second conductive layer are electrically isolated from each other; and a redistribution layer (RDL) on the first side of the glass core, the RDL including an electrical routing electrically coupled with the first conductive layer.

Example 17 includes the package of example 16, wherein the RDL is a first RDL, and further including a second RDL on the second side of the glass core, the second RDL including an electrical routing electrically coupled with the second conductive layer.

Example 18 includes the package of example 17, wherein the first RDL is included in a first buildup layer and the second RDL is included in a second buildup layer.

Example 19 includes the package of example 16, wherein the first conductive layer is electrically coupled with a Vdd and the second conductive layer is electrically coupled with a Vss.

Example 20 includes the package of example 16, wherein the TGV is a plurality of TGVs.

Example 21 includes the package of example 20, wherein the first conductive layer of a first TGV is electrically coupled with a first conductive layer of a second TGV; and wherein a second conductive layer of the first TGV is electrically coupled with a second conductive layer of the second TGV.

Example 22 includes the package of any one of examples 16-21, wherein the first conductive layer or the second conductive layer includes a selected one of: copper, iridium, oxygen, aluminum, or ruthenium.

Example 23 includes the package of any one of examples 16-21, wherein the dielectric layer includes a selected one of: titanium, hafnium, oxygen, or hertzium.

What is claimed is:

1. A capacitor comprising:
   a glass layer with a first side and a second side opposite the first side;
   a through glass via (TGV) that extends from the first side of the glass layer to the second side of the glass layer;
   a first conductive layer on a wall of the TGV;
   a dielectric layer on the first conductive layer within the TGV, wherein the dielectric layer has an end with a top surface at a same level as a top surface of an end of the first conductive layer; and
   a second conductive layer on the dielectric layer within the TGV, wherein the first conductive layer and the second conductive layer are electrically isolated from each other.

2. The capacitor of claim 1, wherein a shape of the TGV at the first side of the glass layer is a selected one of: a circle, an oval, or a rectangle.

3. The capacitor of claim 1, wherein the TGV is a blind via.

4. The capacitor of claim 1, wherein the TGV is a plurality of TGVs.

5. The capacitor of claim 4, wherein the first conductive layer of a first TGV is electrically coupled with a first conductive layer of a second TGV; and wherein a second conductive layer of the first TGV is electrically coupled with a second conductive layer of the second TGV.

6. The capacitor of claim 1, wherein the first conductive layer or the second conductive layer includes a selected one of: copper, iridium, oxygen, aluminum, or ruthenium.

7. The capacitor of claim 1, wherein the dielectric layer includes a selected one of: titanium, hafnium, oxygen, or hertzium.

8. The capacitor of claim 1, further comprising a buildup layer on the first side of the glass layer or the second side of the glass layer, the buildup layer includes one or more electrical trace that is electrically coupled with the first conductive layer or the second conductive layer.

9. A method comprising:
   providing a glass layer having a first side and a second side opposite the first side;
   forming a through glass via (TGV) in the glass layer, the TGV extending from the first side of the glass layer to the second side of the glass layer;
   depositing a first layer of electrically conductive material on a wall of the TGV;
   depositing a dielectric on the first layer of electrically conductive material, wherein the dielectric layer has an end with a top surface at a same level as a top surface of an end of the first conductive layer; and
   depositing a second layer of electrically conductive material on the dielectric, wherein the first layer of conductive material and the second layer of conductive material are electrically isolated from each other.

10. The method of claim 9, wherein depositing the first layer of electrically conductive material or depositing the second layer of electrically conductive material further includes depositing using an atomic layer deposition (ALD) process.

11. The method of claim 9, wherein depositing the dielectric further includes depositing the dielectric using an ALD process.

12. The method of claim 9, wherein the TGV has an aspect ratio of greater than 8.

13. The method of claim 9, wherein the dielectric is a first dielectric; and further comprising:
   depositing a second dielectric on the second layer of electrically conductive material; and
   depositing a third layer of electrically conductive material on the second dielectric, wherein the third layer of electrically conductive material is electrically isolated from the second layer of electrically conductive material, and wherein the first layer of electrically conductive material is electrically coupled with the third layer of electrically conductive material.

14. The method of claim 9, further comprising:
   forming a buildup layer on the first side of the glass layer, the buildup layer including a plurality of electrical traces, wherein at least one of the plurality of electrical traces is electrically coupled with the first layer of electrically conductive material.

15. The method of claim 14, wherein the buildup layer is a first buildup layer and wherein the plurality of electrical traces is a first plurality of electrical traces; and further comprising:
   forming a second buildup layer on the second side of the glass layer, the second buildup layer including a plurality of second electrical traces, wherein at least one of the plurality of second electrical traces is electrically coupled with the second layer of the electrically conductive material.

16. A package comprising:
   a glass core with a first side and a second side opposite the first side, the glass core including:
      a TGV that extends from the first side of the glass core to the second side of the glass core;
      a first conductive layer on a wall of the TGV;
      a dielectric layer on the first conductive layer within the TGV, wherein the dielectric layer has an end with a top surface at a same level as a top surface of an end of the first conductive layer; and
      a second conductive layer on the dielectric layer within the TGV, wherein the first conductive layer and the second conductive layer are electrically isolated from each other; and
   a redistribution layer (RDL) on the first side of the glass core, the RDL including an electrical routing electrically coupled with the first conductive layer.

17. The package of claim 16, wherein the RDL is a first RDL, and further including a second RDL on the second side of the glass core, the second RDL including an electrical routing electrically coupled with the second conductive layer.

18. The package of claim 17, wherein the first RDL is included in a first buildup layer and the second RDL is included in a second buildup layer.

19. The package of claim 16, wherein the first conductive layer is electrically coupled with a Vdd and the second conductive layer is electrically coupled with a Vss.

20. The package of claim 16, wherein the TGV is a plurality of TGVs.

21. The package of claim 20, wherein the first conductive layer of a first TGV is electrically coupled with a first conductive layer of a second TGV; and wherein a second conductive layer of the first TGV is electrically coupled with a second conductive layer of the second TGV.

22. The package of claim 16, wherein the first conductive layer or the second conductive layer includes a selected one of: copper, iridium, oxygen, aluminum, or ruthenium.

23. The package of claim 16, wherein the dielectric layer includes a selected one of: titanium, hafnium, oxygen, or hertzium.

* * * * *